(12) United States Patent
Tani

(10) Patent No.: US 7,215,166 B2
(45) Date of Patent: May 8, 2007

(54) DLL CIRCUIT WITH DELAY EQUAL TO ONE CLOCK CYCLE

(75) Inventor: Hiroaki Tani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 10/942,129

(22) Filed: Sep. 16, 2004

(65) Prior Publication Data
US 2005/0231249 A1    Oct. 20, 2005

(30) Foreign Application Priority Data
Apr. 19, 2004    (JP) ............................. 2004-123380

(51) Int. Cl.
*H03L 7/06* (2006.01)
(52) U.S. Cl. ...................... 327/158; 327/156; 327/159; 375/376; 331/17
(58) Field of Classification Search .................... None
See application file for complete search history.

(56) References Cited

U.S. PATENT DOCUMENTS 6,198,689 B1    3/2001 Yamazaki et al. .......... 365/233
6,294,938 B1 *  9/2001 Coddington et al. ........ 327/158
6,400,643 B1 *  6/2002 Setogawa ................... 365/233
6,765,976 B1 *  7/2004 Oh ............................. 375/376
6,774,679 B2 *  8/2004 Nogami ......................... 327/3
6,839,301 B2 *  1/2005 Lin et al. .................... 365/233

FOREIGN PATENT DOCUMENTS
JP    2000-163963    6/2000

* cited by examiner

*Primary Examiner*—Timothy P. Callahan
*Assistant Examiner*—An T. Luu
(74) *Attorney, Agent, or Firm*—ArentFox LLP

(57) ABSTRACT

A DLL circuit includes a phase comparator configured to compare timing between a first clock signal and a second clock signal, a delay circuit configured to delay the first clock signal for output as the second clock signal by a delay length responsive to a result of comparison by the phase comparator, and a control circuit configured to suspend supply of the first clock signal to the phase comparator temporarily while the second clock signal is supplied to the phase comparator.

9 Claims, 13 Drawing Sheets

DLL CIRCUIT WITH DELAY EQUAL TO ONE CLOCK CYCLE

CROSS-REFERENCE TO RELATED APPLICATIONS

The present application is based upon and claims the benefit of priority from the prior Japanese Patent Application No. 2004-123380 filed on Apr. 19, 2004, with the Japanese Patent Office, the entire contents of which are incorporated herein by reference.

BACKGROUND OF THE INVENTION

1. Field of the Invention

The invention generally relates to DLL circuits, and particularly relates to a DLL circuit which generates a clock signal having a predetermined delay relative to a clock signal input from an exterior.

2. Description of the Related Art

A DLL (Delay Locked Loop) circuit serves to control the delay time of a delay element by a feedback loop, such that a delay clock signal derived by delaying an input clock signal by the delay element and the input clock signal have a predetermined delay time difference with each other.

Figure 1:
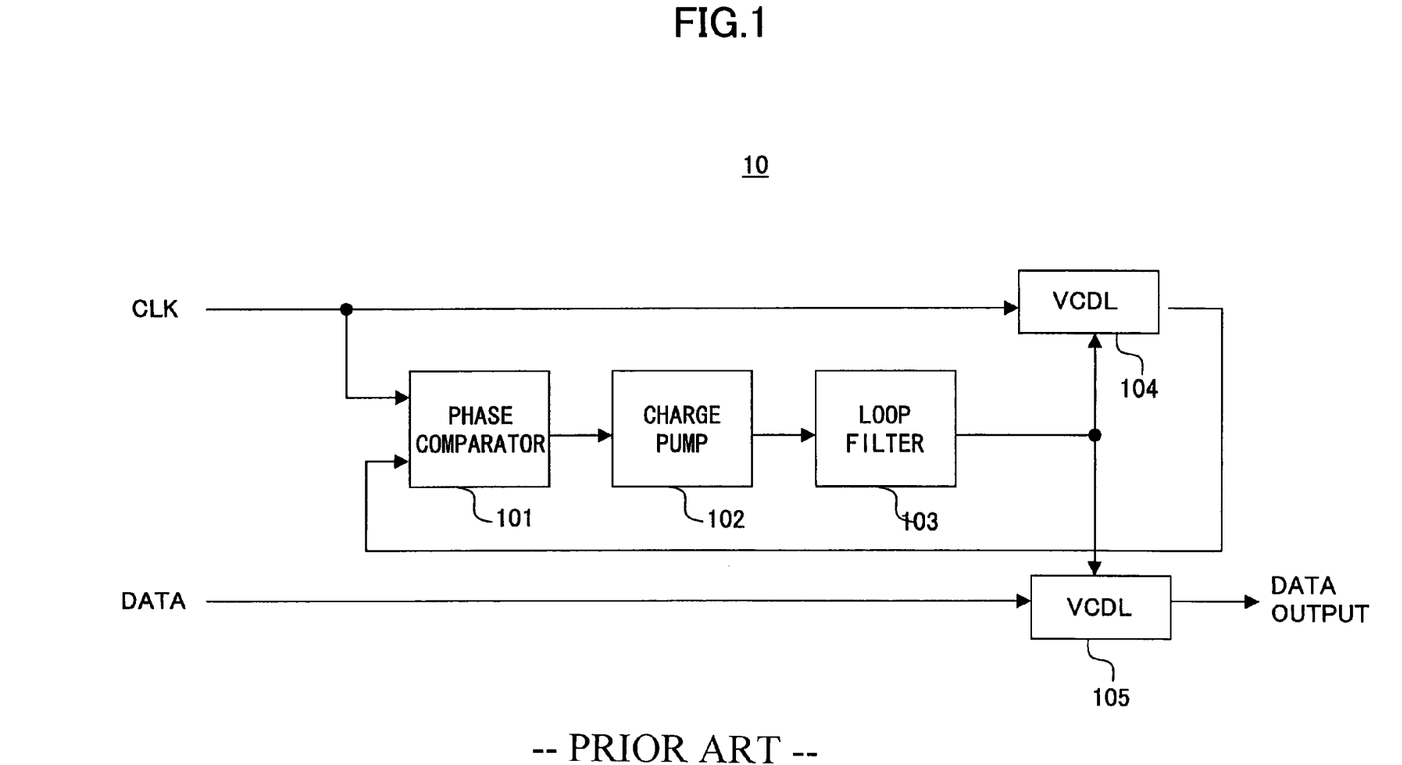
FIG. 1 is a block diagram showing an example of the construction of a related-art DLL circuit.

FIG. 1 is a block diagram showing an example of the construction of a related-art DLL circuit.

A DLL circuit 10 of FIG. 1 includes a phase comparator 101, a charge pump 102, a loop filter 103, a voltage-controlled delay element (VCDL) 104, and a voltage-controlled delay element (VCDL) 105. A clock signal CLK input from an exterior is supplied to the voltage-controlled delay element 104. The voltage-controlled delay element 104 receives the output of the loop filter 103 as an input control voltage, and delays the clock signal CLK by a delay length responsive to the control voltage. As for the construction of the voltage-controlled delay element 104, provision may be made to reduce a delay length in response to a drop in the input control voltage, or may be made to reduce a delay length in response to a rise in the input control voltage. For the sake of convenience of explanation, the construction assumed here is such that the delay length is reduced in response to a drop in the input control voltage.

The delay clock signal that is output from the voltage-controlled delay element 104 is supplied to one input of the phase comparator 101. The other input of the phase comparator 101 receives the clock signal CLK input from the exterior.

The phase comparator 101 compares the timing of edges of the clock signal CLK with the timing of edges of the delay clock signal. When the timing of the clock signal CLK is earlier, the phase comparator 101 supplies a down-instruction signal to the charge pump 102. In response to the down-instruction signal, the charge pump 102 draws electric charge out of the loop filter 103, resulting in the output voltage of the loop filter 103 being lowered. Consequently, the delay time of the voltage-controlled delay element 104 is shortened.

When the timing of the clock signal CLK is later, the phase comparator 101 supplies a up-instruction signal to the charge pump 102. In response to the up-instruction signal, the charge pump 102 supplies electric charge to the loop filter 103, resulting in the output voltage of the loop filter 103 being raised. Consequently, the delay time of the voltage-controlled delay element 104 is lengthened.

Through such feedback control, the delay of the delay clock signal is adjusted in such a manner that the edges of the delay clock signal output from the voltage-controlled delay element 104 are aligned with the edges of the clock signal CLK input from the exterior. Specifically, the delay of the voltage-controlled delay element 104 is adjusted to be equal to once clock cycle of the clock signal CLK.

The voltage-controlled delay element 105 has the same circuit construction as the voltage-controlled delay element 104, and receives the same output voltage of the loop filter 103 that is supplied to the voltage-controlled delay element 104. With this provision, the voltage-controlled delay element 105 delays a data signal DATA by a delay length equal to the clock cycle of the clock signal. The delay length controlled by the DLL circuit 10 is stable regardless of the operating voltage of the DLL circuit 10 or ambient temperature. In this manner, a data path having a desired delay length is provided.

[Patent reference 1] Japanese Patent Application Publication No. 2000-163963

SUMMARY OF THE INVENTION

It is a general object of the present invention to provide a DLL circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a DLL circuit particularly pointed out in the specification in such full, clear, concise, and exact terms as to enable a person having ordinary skill in the art to practice the invention.

To achieve these and other advantages in accordance with the purpose of the invention, the invention provides a DLL circuit, including a phase comparator configured to compare timing between a first clock signal and a second clock signal, a delay circuit configured to delay the first clock signal for output as the second clock signal by a delay length responsive to a result of comparison by the phase comparator, and a control circuit configured to suspend supply of the first clock signal to the phase comparator temporarily while the second clock signal is supplied to the phase comparator.

In the DLL circuit according to at least one embodiment of the invention, the control circuit temporarily suspends the supply of the first clock signal for some time duration, so that the phase comparator is in such a state as to detect an edge of the second clock signal supplied from the delay circuit and to wait for an edge to be compared with the detected edge. When the control circuit resumes the supply of the first clock signal, thus, the phase comparator treats the edge of the second clock signal as an edge of earlier timing, and compares this edge with an edge of the first clock signal appearing immediately after this timing. If the delay circuit is set to a delay length shorter than one clock cycle, the edge of the second clock signal is compared with an edge appearing one cycle after a corresponding edge of the first clock signal. With this provision, therefore, the delay length of the delay circuit in the DLL circuit is adjusted so as to be equal to one clock cycle of the first clock signal.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the construction of the DLL circuit 10 shown in FIG. 1, the edge comparison by the phase comparator 101 must exhibit a displacement equal to one clock cycle in order for the delay length to be equal to one cycle of the clock signal CLK. Namely, when the first edge of the clock signal CLK is delayed to correspond to the first edge of the delay clock, the second edge immediately following the first edge of the clock signal CLK needs to be compared with the first edge of the delay clock as a corresponding edge for comparison by the phase comparator 101. The delay length of the voltage-controlled delay element 104 thus needs to fall within an initial range between one cycle and two cycles of the clock signal CLK. Otherwise, the delay of the voltage-controlled delay element 104 does not become equal to one clock cycle when the DLL circuit 10 is stabilized.

If the initial value of the delay of the voltage-controlled delay element 104 is less than one cycle of the clock signal CLK, for example, the first edge of the delay clock is compared with the first edge of the clock signal CLK which is immediately preceding in time. Control is thus made such as to shorten the delay length. As a result, the control operation comes into a stable state when the delay length reaches the minimum adjustable delay of the voltage-controlled delay element 104. If the initial value of the delay of the voltage-controlled delay element 104 is larger than two cycles of the clock signal CLK, the first edge of the delay clock is compared with the third edge of the clock signal CLK which is immediately preceding in time. As a result, a stabile state is achieved when the first edge of the delay clock becomes aligned with the third edge of the clock signal CLK, i.e., when the delay length becomes equal to two clock cycles.

Moreover, where the clock signal CLK is temporarily suspended while the DLL circuit 10 is placed in a stabile state, and then resumes, the delay will be stabilized at the point closest to the maximum delay length of the voltage-controlled delay element 104, among points corresponding to integral multiples of the cycle of the clock signal CLK.

Accordingly, there is a need for a DLL circuit which can reliably stabilize a delay length such as to make it equal to one cycle of the input clock signal.

In the following, embodiments of the present invention will be described with reference to the accompanying drawings.

Figure 2:
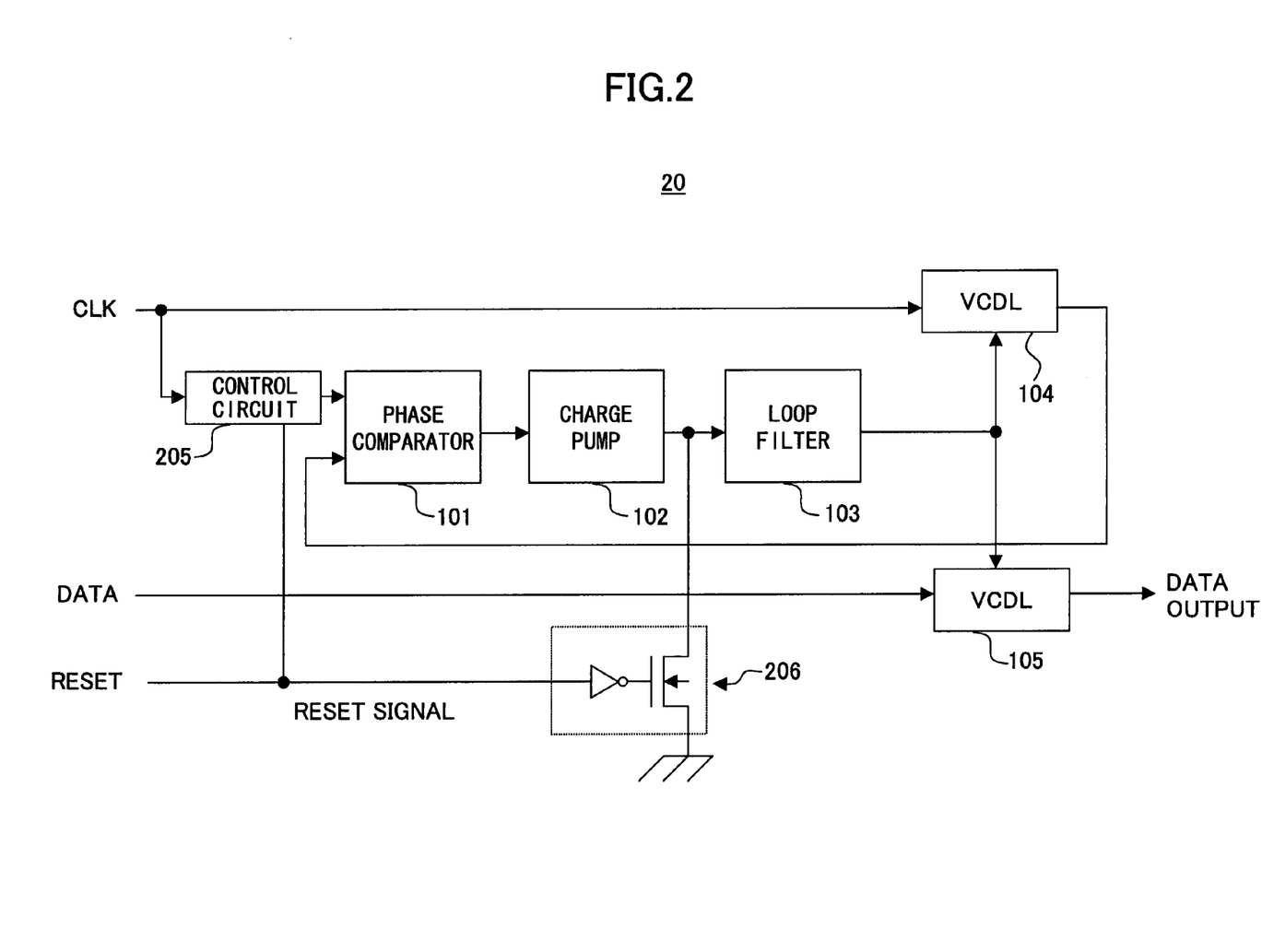
FIG. 2 is a block diagram showing an example of the construction of a first embodiment of a DLL circuit according to the invention.

FIG. 2 is a block diagram showing an example of the construction of a first embodiment of the DLL circuit according to the invention. A DLL circuit 20 of FIG. 2 includes the phase comparator 101, the charge pump 102, the loop filter 103, the voltage-controlled delay element (VCDL) 104, the voltage-controlled delay element (VCDL) 105, a control circuit 205, and a reset circuit 206. The DLL circuit 20 of FIG. 2 is preferably implemented as a semiconductor integrated circuit.

The clock signal CLK input from an exterior is supplied to the voltage-controlled delay element 104. The voltage-controlled delay element 104 receives the output of the loop filter 103 as an input control voltage, and delays the clock signal CLK by a delay length responsive to the control voltage. As for the construction of the voltage-controlled delay element 104, provision may be made to reduce a delay length in response to a drop in the input control voltage, or may be made to reduce a delay length in response to a rise in the input control voltage. For the sake of convenience of explanation, the construction assumed here is such that the delay length is reduced in response to a drop in the input control voltage.

The delay clock signal that is output from the voltage-controlled delay element 104 is supplied to one input of the phase comparator 101. The other input of the phase comparator 101 receives the clock signal CLK via the control circuit 205.

In an initial state, a reset signal RESET is set to LOW. With this setting, the control circuit 205 blocks the clock signal CLK, which is thus not supplied to the phase comparator 101. Moreover, since the reset signal RESET is LOW, an NMOS transistor of the reset circuit 206 becomes conductive, thereby coupling the input of the loop filter 103 to a ground potential to draw out the electric charge of the loop filter 103. As a result, the output voltage of the loop filter 103 is reduced, setting the voltage-controlled delay element 104 to a minimum delay length.

Thereafter, the reset signal RESET is changed to HIGH. After the passage of a predetermined time period, the control circuit 205 supplies the clock signal CLK to the phase comparator 101. Since the clock signal CLK is not supplied during the predetermined time period, the phase comparator 101 is in such a state as to detect an edge of the delay clock signal supplied from the voltage-controlled delay element 104 and to wait for an edge to be compared with the detected edge. When the supply of the clock signal CLK from the control circuit 205 starts, thus, the phase comparator 101 treats the edge of the delay clock signal as an edge of earlier timing, and compares this edge with an edge of the clock signal CLK appearing immediately after this timing. Since the voltage-controlled delay element 104 is set to a minimum delay length, the edge of the delay clock is compared with an edge appearing one cycle after a corresponding edge of the clock signal CLK, assuming that the minimum delay length is shorter than one clock cycle.

Figure 3:
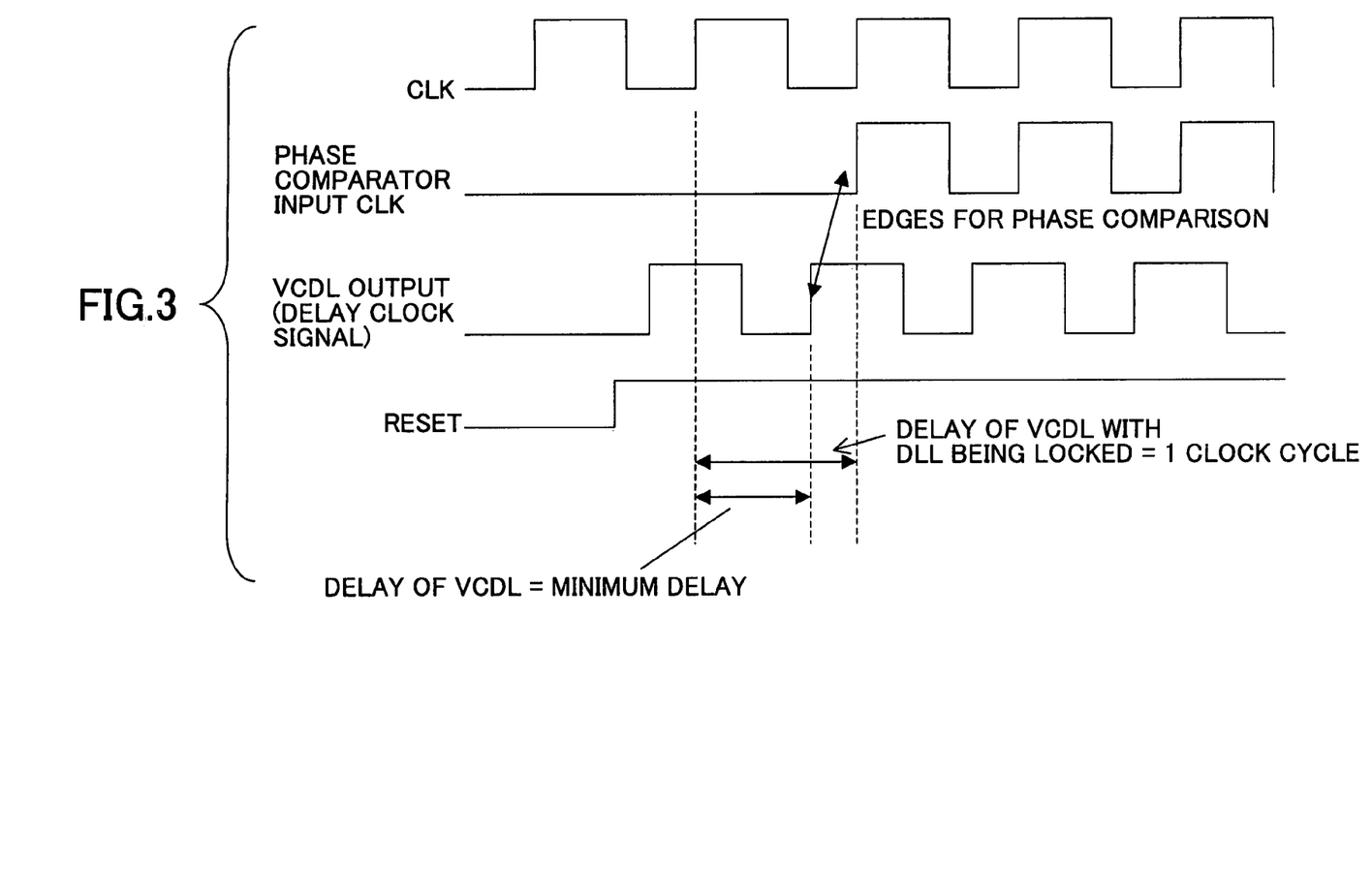
FIG. 3 is a signal waveform chart showing the operation of the DLL circuit of FIG. 2.

FIG. 3 is a signal waveform chart showing the operation of the DLL circuit 20 of FIG. 2. As shown in FIG. 3, only after a predetermined time period following a change to HIGH of the reset signal, does the clock signal CLK appear as a phase comparator input. Then, the timing of an edge of the clock signal CLK serving as a phase comparator input is compared with the timing of an edge of the delay clock signal. This comparison reveals that the clock signal CLK is the one that is behind. The delay length of the voltage-controlled delay element 104 is thus increased through control based on the phase comparator 101, the charge pump 102, and the loop filter 103. As a result, the delay length of the voltage-controlled delay element 104 increases from the minimum delay length shown in FIG. 3 to reach a stable delay length that is equal to one clock length.

Through this feedback control, the delay length of the voltage-controlled delay element 104 is adjusted equal to one cycle of the clock signal CLK.

The voltage-controlled delay element 105 has the same circuit construction as the voltage-controlled delay element 104, and receives the same output voltage of the loop filter 103 that is supplied to the voltage-controlled delay element 104. With this provision, the voltage-controlled delay element 105 delays a data signal DATA by a delay length equal to the clock cycle of the clock signal. The delay length controlled by the DLL circuit 10 is stable regardless of the operating voltage of the DLL circuit 10 or ambient temperature. In this manner, a data path having a desired delay length is provided.

In the description provided above, the reset circuit 206 is used for control to keep the delay length of the voltage-controlled delay element 104 to its minimum. The reset circuit 206, however, is not necessarily required. When the control circuit 205 is suspending the supply of the clock signal CLK, the phase comparator 101 receives only the delay clock signal from the voltage-controlled delay element 104. In such a state, provision may be made such that control operation makes a constant attempt to reduce the delay length of the voltage-controlled delay element 104. With such provision, the delay length can be adjusted to its minimum by the time the supply of the clock signal CLK starts if the period of suspension of the clock signal CLK is sufficiently long.

Moreover, the period of suspension of the clock signal CLK is equal to one pulse in the illustration of FIG. 3. However, the period of suspension of the clock signal may as well be more than a one-pulse period, and may be set to a time length equal to three pulses more or less, thereby achieving a stable, reliable operation.

In the description provided above, the delay length of the voltage-controlled delay element 104 is set to the minimum delay length. However, the delay length does not have to be reduced all the way down to its minimum. To be specific, it suffices to make the delay length of the voltage-controlled delay element 104 less than one cycle of the clock signal CLK.

Figure 4:
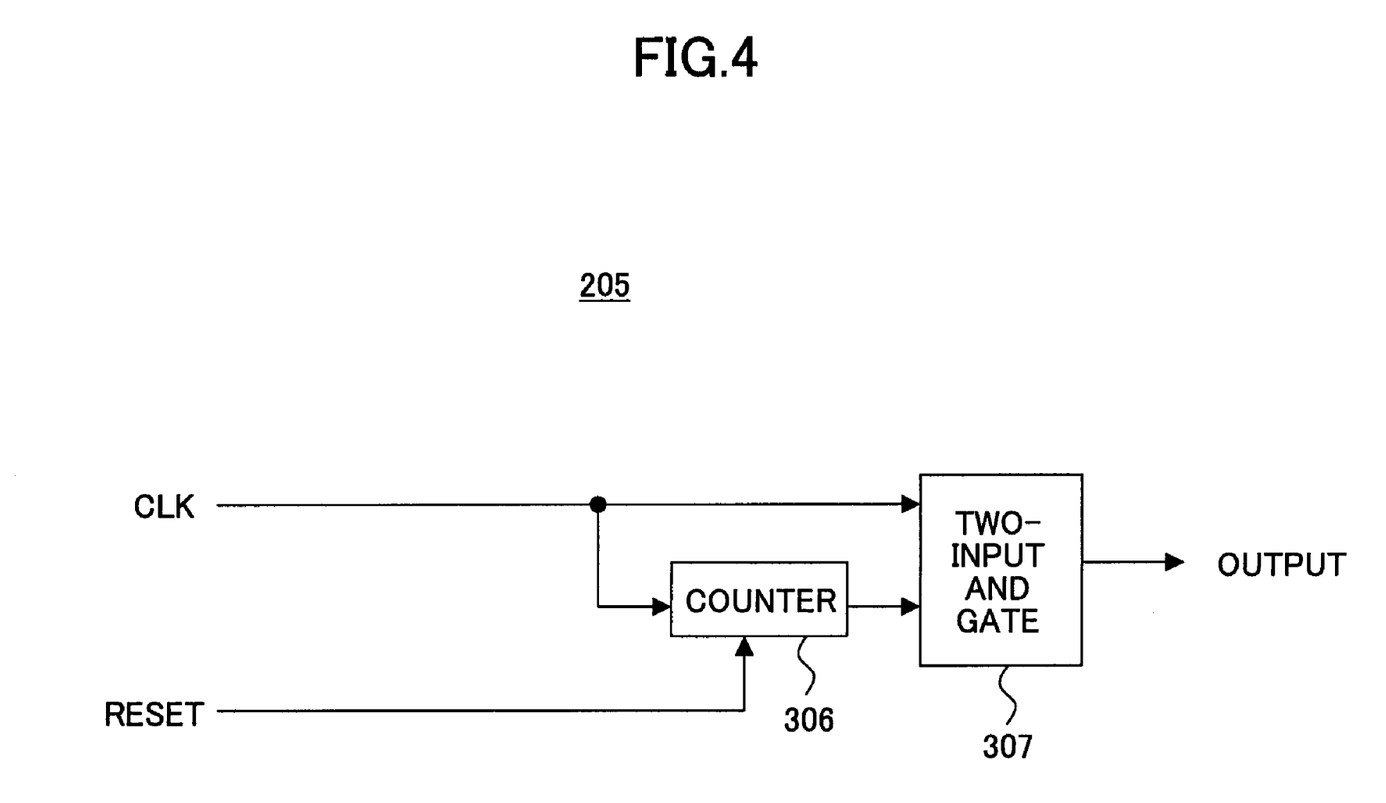
FIG. 4 is a circuit diagram showing an example of the construction of a control circuit.

FIG. 4 is a circuit diagram showing an example of the construction of the control circuit 205. The control circuit 205 of FIG. 4 includes a counter 306 and a two-input AND gate 307. The counter 306 does not operate when the reset signal RESET is LOW. The output of the counter 306 in such state is LOW, and the output of the two-input AND gate 307 is maintained at LOW. When the reset signal RESET is HIGH, the counter 306 counts the pulses of the clock signal CLK. Upon counting a predetermined number, the counter 306 changes its output to HIGH. With the output of the counter 306 being HIGH, the clock signal CLK passes through the two-input AND gate 307 to be supplied to the phase comparator 101.

In this manner, the control circuit 205 starts the supply of the clock signal CLK to the phase comparator 101 after the passage of a predetermined time period following a change to HIGH of the reset signal RESET.

Figure 5:
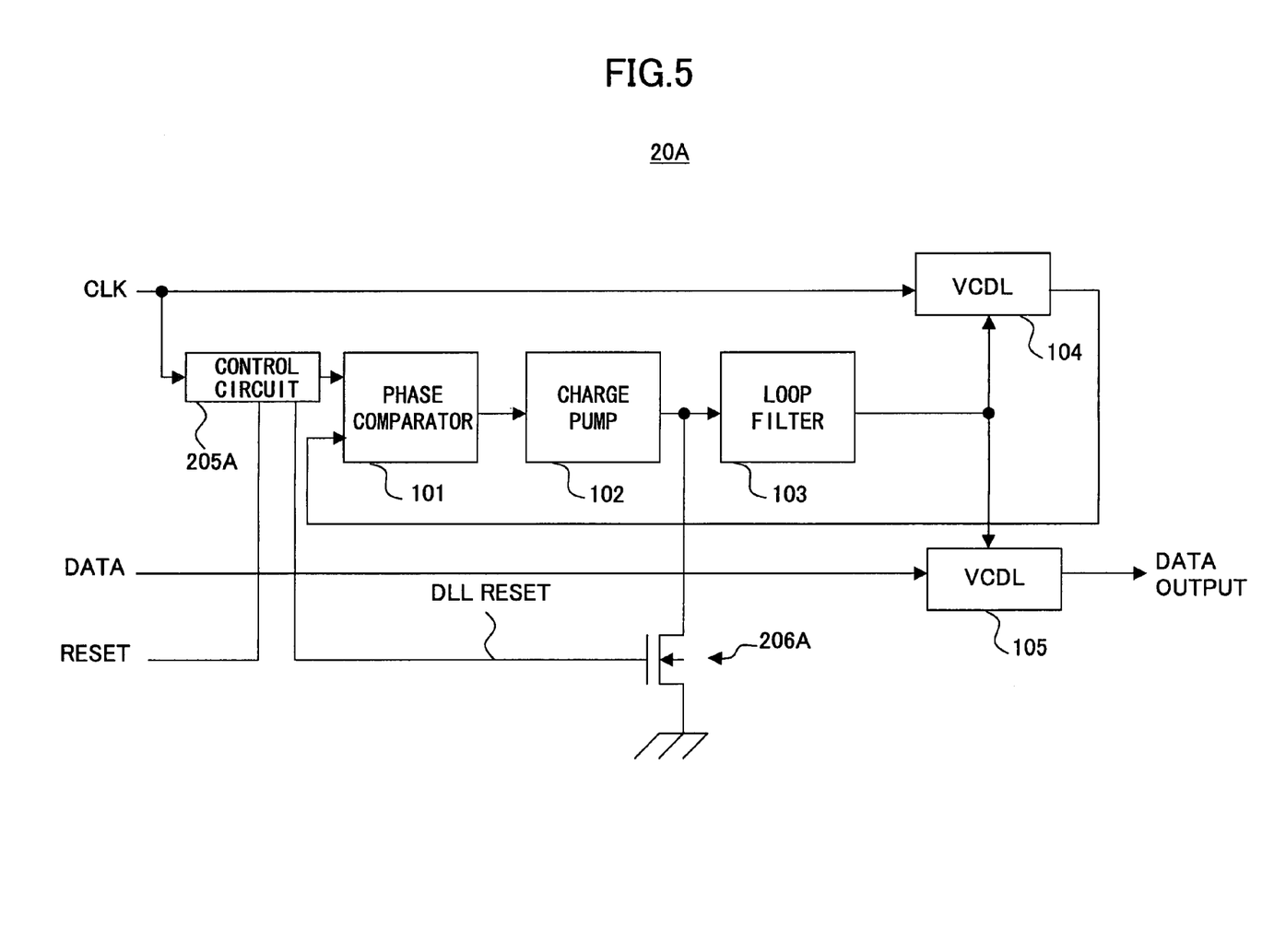
FIG. 5 is a block diagram showing an example of the construction of a second embodiment of the DLL circuit according to the invention.

FIG. 5 is a block diagram showing an example of the construction of a second embodiment of the DLL circuit according to the invention. In FIG. 5, the same elements as those of FIG. 2 are referred to by the same numbers, and a description thereof will be omitted. A DLL circuit 20A of FIG. 5 differs from the DLL circuit 20 of FIG. 2 in that the control circuit 205 is replaced by a control circuit 205A, and that the reset circuit 206 is replaced by a reset circuit 206A.

Figure 6:
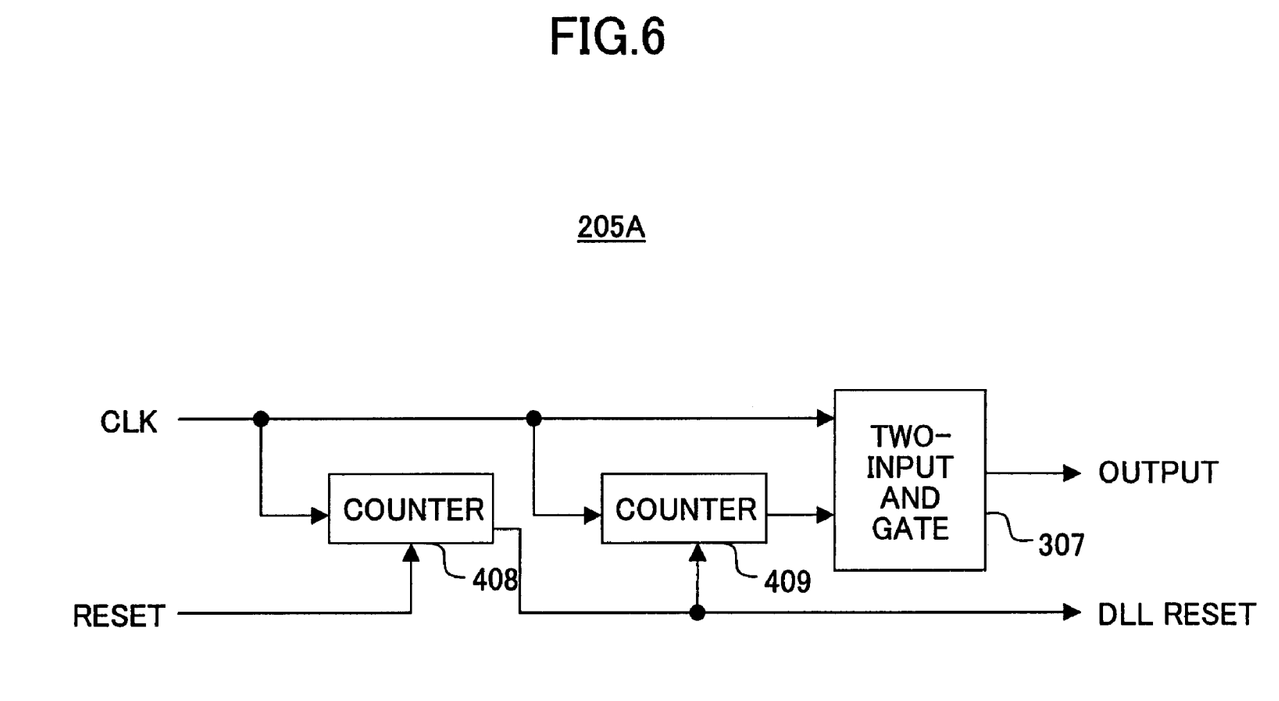
FIG. 6 is a circuit diagram showing an example of the construction of the control circuit.
Figure 7:
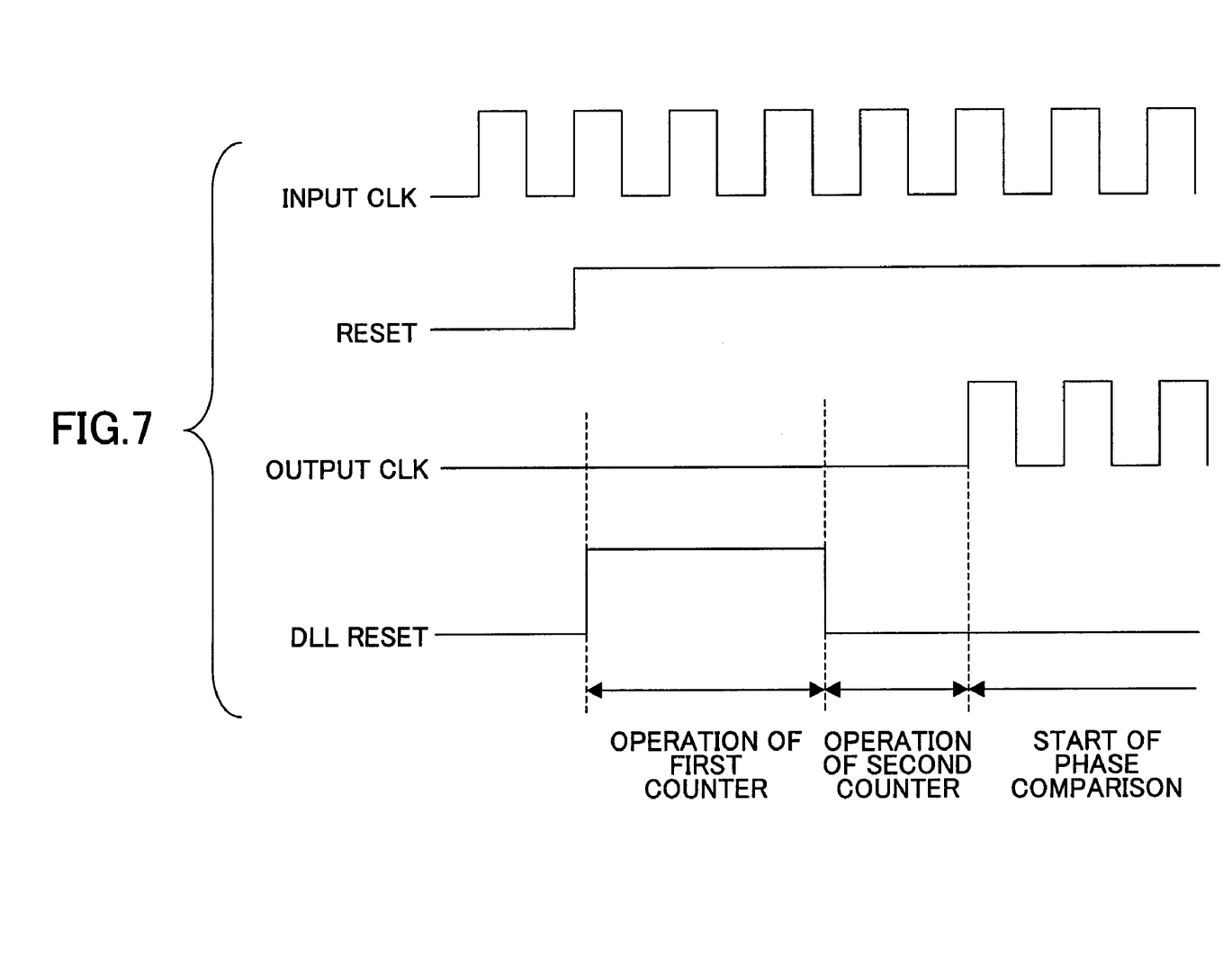
FIG. 7 is a signal waveform chart showing the operation of the control circuit of FIG. 6.

FIG. 6 is a circuit diagram showing an example of the construction of the control circuit 205A. The control circuit 205A of FIG. 6 includes a counter 408, a counter 409, and the two-input AND gate 307. FIG. 7 is a signal waveform chart showing the operation of the control circuit 205A of FIG. 6.

The counter 408 does not operate when the reset signal RESET is LOW. The output (DLL RESET) of the counter 408 in this condition is LOW, so that the counter 409 is not operating either. Further, the NMOS transistor of the reset circuit 206A shown in FIG. 5 is OFF. The output of the counter 409 is LOW, and the output of the two-input AND gate 307 is maintained at LOW.

When the reset signal RESET changes to HIGH, the counter 408 changes its output (DLL RESET) to HIGH, and also starts counting the pulses of the clock signal CLK. In FIG. 7, the operation period of the counter 408 is shown as "OPERATION OF FIRST COUNTER". During this operation period, DLL RESET is HIGH, so that the NMOS transistor of the reset circuit 206A shown in FIG. 5 stays conductive, thereby making the delay length of the voltage-controlled delay element 104 equal to the minimum delay length.

Upon counting a predetermined number, the counter 408 returns its output to LOW. In response to the fall of the output of the counter 408, the counter 409 starts counting the pulses of the clock signal CLK. In FIG. 7, the operation period of the counter 409 is shown as "OPERATION OF SECOND COUNTER". Upon counting a predetermined number, the counter 409 changes its output to HIGH. With the output of the counter 409 being HIGH, the clock signal CLK passes through the two-input AND gate 307 to be supplied to the phase comparator 101.

In this manner, the control circuit 205A sets the delay length of the voltage-controlled delay element 104 to the minimum value during a first predetermined time period following the change to HIGH of the reset signal RESET, and starts the supply of the clock signal CLK to the phase comparator 101 after the passage of a second predetermined time period following the first predetermined time period. In the first embodiment, the time period for the adjustment of the delay length of the voltage-controlled delay element 104 depends on the period during which the reset signal is LOW, so that proper control is necessary on the part of the system to control the LOW period of the reset signal. In the second embodiment, on the other hand, the counting operation of the counter 408 defines the period for adjustment, so that there is no need on the part of the system to take into account the detail of the reset signal such as the duration thereof. This makes it easier to control the DLL circuit.

Figure 8:
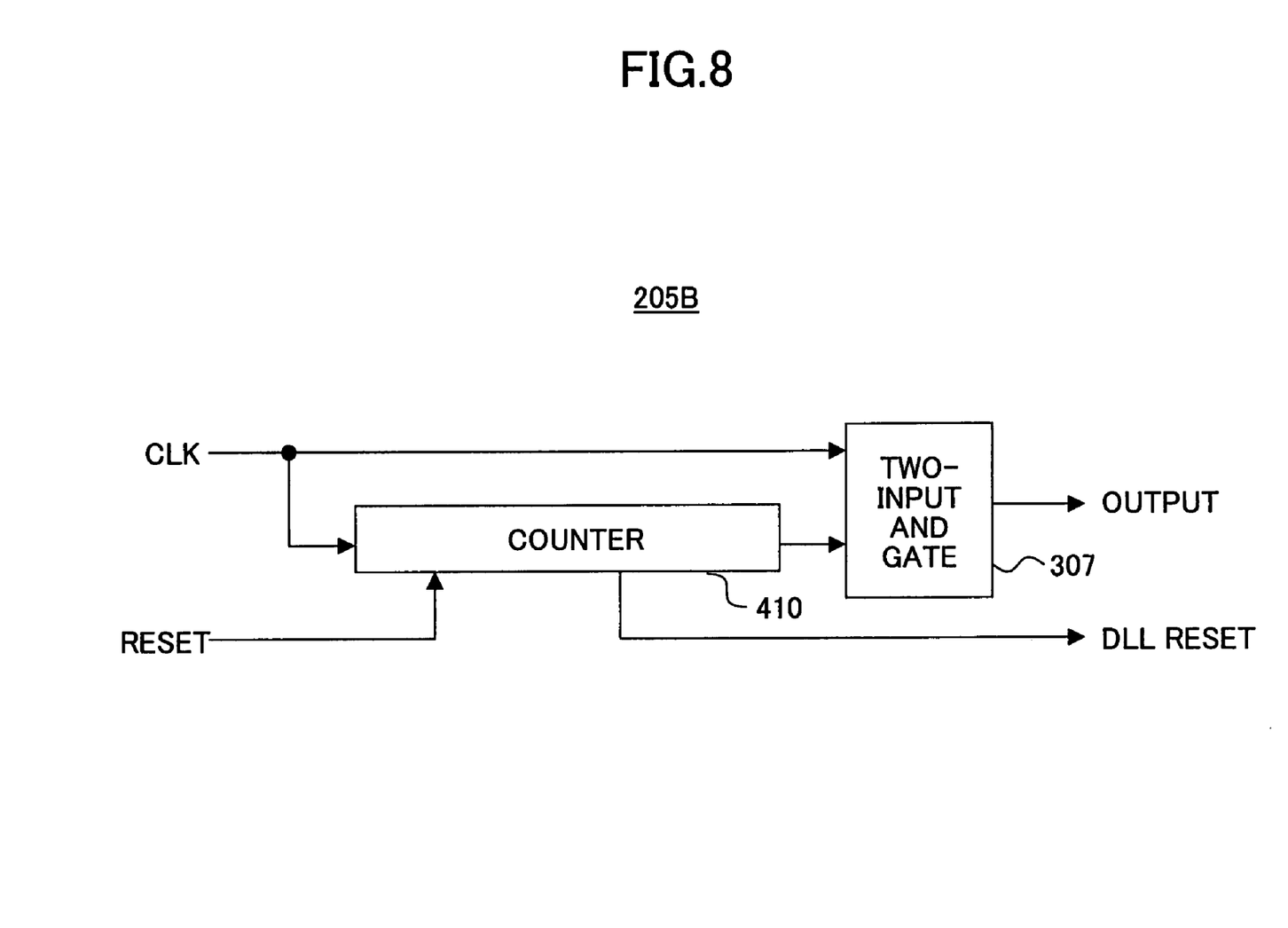
FIG. 8 is a circuit diagram showing a variation of the control circuit.

FIG. 8 is a circuit diagram showing a variation of the control circuit 205A. In the control circuit 205A of FIG. 6, the counter for counting a first count and the counter for counting a second count are provided for the purpose of defining the period for delay adjustment and the period of clock suspension, respectively. For the purpose of defining these two periods, however, two counters may not be necessary. A single counter may be provided to perform a single counting operation. Provision is then made to assert a signal both at the timing the count reaches a first number and at the timing the count reaches a second number.

In the control circuit 205B of FIG. 8, a single counter 410 is provided in place of the counters 408 and 409 of FIG. 6. In response to a change to HIGH in the reset signal RESET, the counter 410 starts counting the pulses of the clock signal CLK, and, at the same time, changes the DLL RESET signal to HIGH. When the count reaches a first number, the DLL RESET signal is changed to LOW. Counting continues thereafter, and an output to the two-input AND gate 307 is changed to HIGH when the count reaches a second number.

The control circuit as described above successfully performs the operation as shown in FIG. 7.

Figure 9:
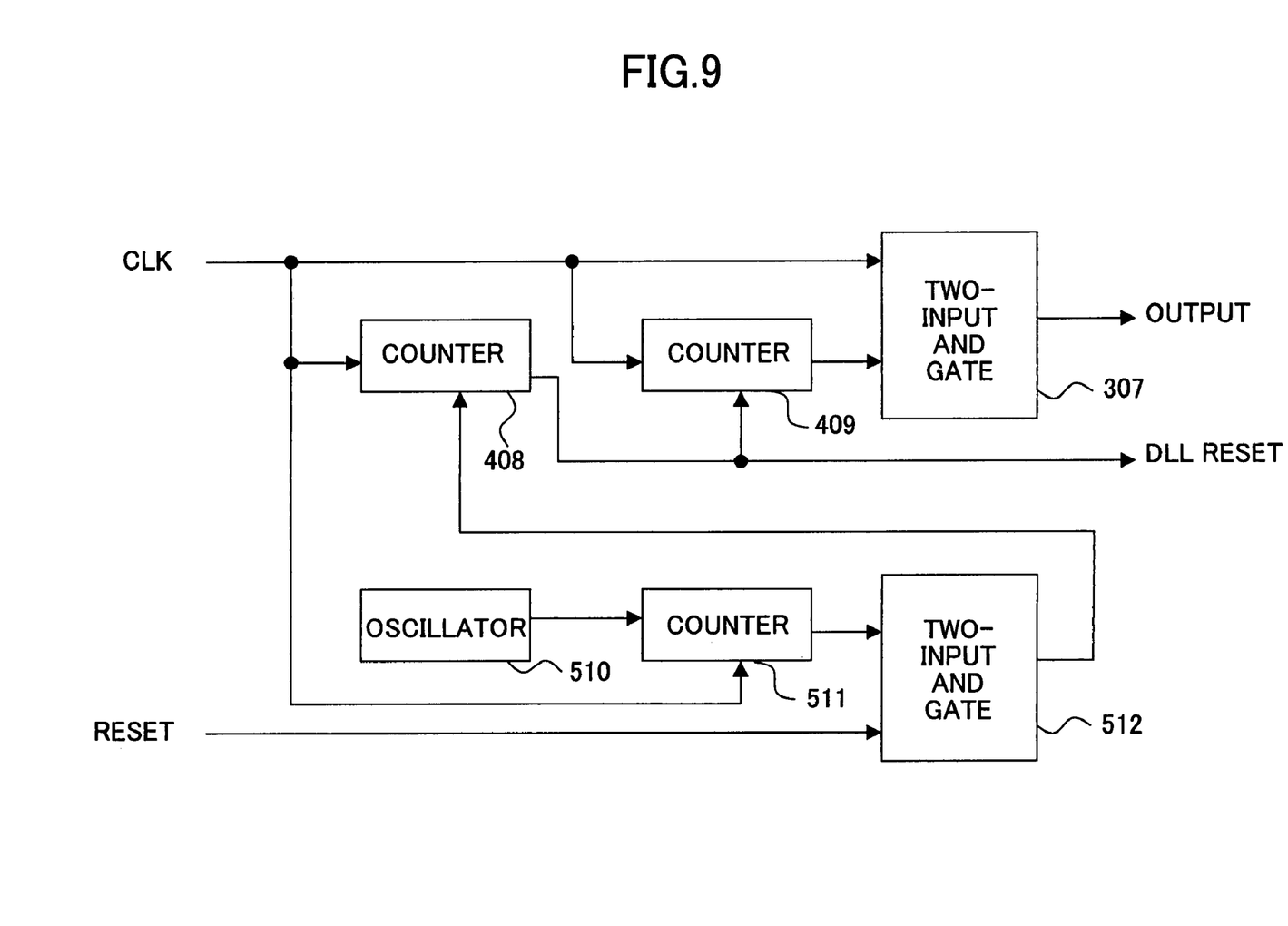
FIG. 9 is a circuit diagram showing another example of the construction of the control circuit.

FIG. 9 is a circuit diagram showing another example of the construction of the control circuit. In FIG. 9, the same elements as those of FIG. 6 are referred to by the same numbers, and a description thereof will be omitted.

In FIG. 9, an oscillator 510, a counter 511, and a two-input AND gate 512 are provided in addition to the construction of the control circuit 205 shown in FIG. 6. The oscillator 510 is constantly oscillating at predetermined frequency. The counter 511 performs counting operation in response to the oscillating clock of the oscillator 510. The reset terminal of the counter 511 receives the clock signal CLK. During the period in which the clock signal CLK is supplied, the counter 511 is constantly subjected to resetting operation.

If the supply of the clock signal CLK stops for some reason, the counter 511 disengages from the reset state, and starts counting operation based on the oscillating clock of the oscillator 510. When the count reaches a predetermined value, the counter 511 changes its output to the two-input AND gate 512 to HIGH. Since the reset signal RESET is in a negated (HIGH) state, the two-input AND gate 512 supplies a HIGH signal to the counter 408 in response to the HIGH signal output from the counter 511. In this construction, the counter 408 is reset by a HIGH reset signal.

In the control circuit of FIG. 9 as described above, when the supply of the clock signal CLK stops for some reason while the DLL circuit is operating in a stabile state, the counter 408 is reset after the passage of a predetermined time period measured by the counter 511. With this, a circuit portion identical to the control circuit 205A of FIG. 6 is reset.

When the supply of the clock signal CLK resumes, the counter 511 is reset, resulting in the output of the two-input AND gate 512 being LOW. In response, the counter 408 recovers from the reset state, so that the same operation as that of the control circuit 205A shown in FIG. 7 will ensue.

In this manner, the period for delay adjustment and the period of clock suspension as shown in FIG. 7 are provided in the case where the supply of the clock signal CLK stops for some reason and subsequently resumes. This makes it possible to set the delay length to its minimum and to establish proper edge correspondence for edge comparison. Accordingly, the delay of the DLL circuit is reliably set to one clock cycle even in the case of suspension and subsequent recovery of the clock signal CLK.

Figure 10:
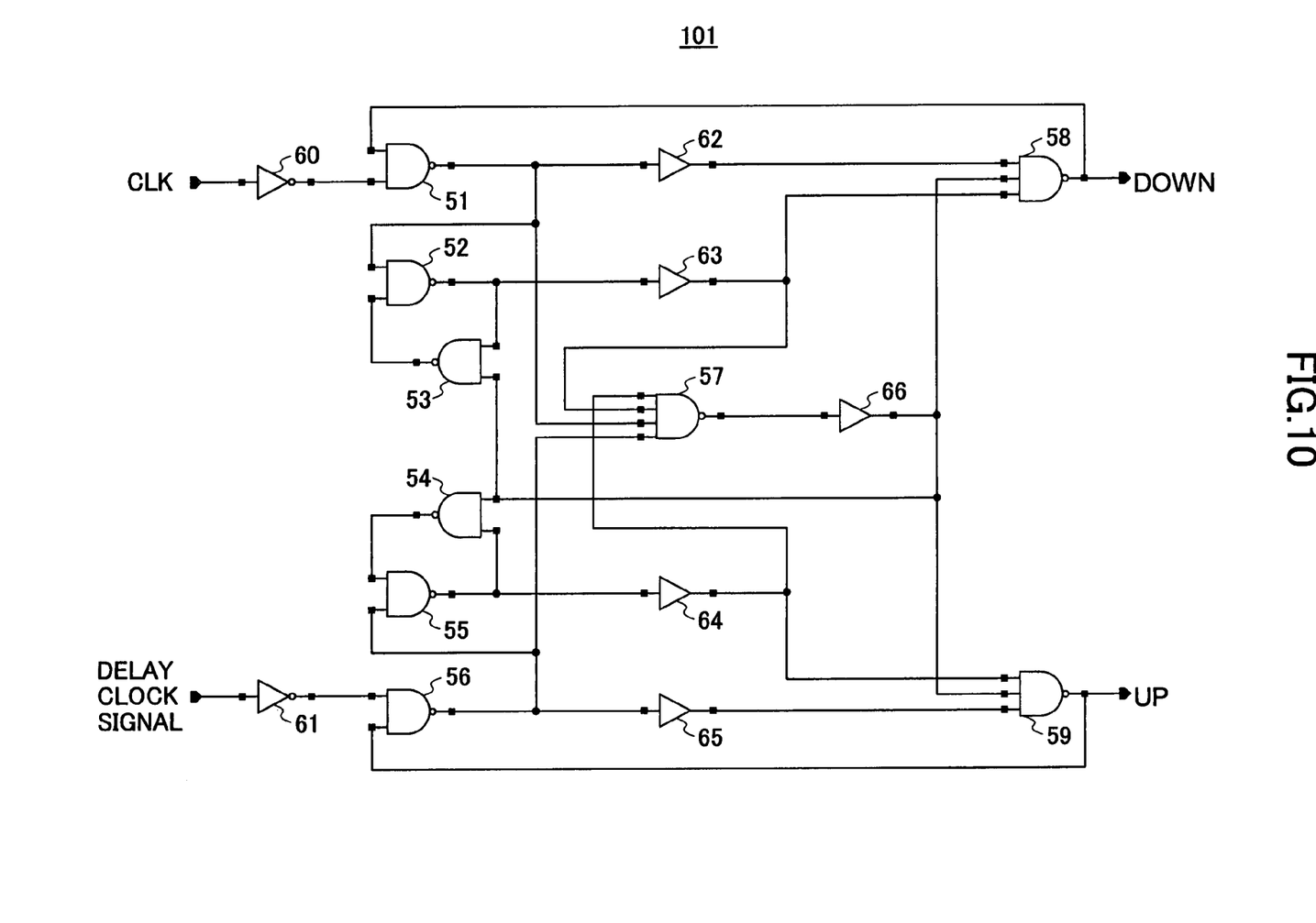
FIG. 10 is a circuit diagram showing an example of the construction of a phase comparator.

FIG. 10 is a circuit diagram showing an example of the construction of the phase comparator 101. The phase comparator 101 of FIG. 10 includes NAND gates 51 through 59, inverters 60 and 61, and buffers 62 through 66.

Outputs DOWN and UP of the phase comparator 101 are negative logic signals. That is, the outputs DOWN and UP are initially maintained at HIGH, and are changed to LOW to indicate assertion. When a rising edge of the clock signal CLK arrives ahead of a rising edge of the delay clock signal, the output of the NAND gate 51 becomes HIGH, resulting in the signal DOWN changing to LOW for assertion. A rising edge of the delay clock signal thereafter arrives. In response, the output of the NAND gate 56 becomes HIGH. Before this HIGH signal reaches the NAND gate 59, the output of the NAND gate 57 changes to LOW, so that the signal UP is kept at HIGH. In response to the LOW output of the NAND circuit 57, the signal DOWN returns to HIGH. In this manner, the signal DOWN is asserted during the period from the rising edge of the clock signal CLK to the rising edge of the delay clock signal if the rising edge of the clock signal CLK is the first to come. If the rising edge of the delay clock signal is the first to come, on the other hand, the signal UP is asserted during the period from the rising edge of the delay clock signal to the rising edge of the clock signal CLK.

Figure 11:
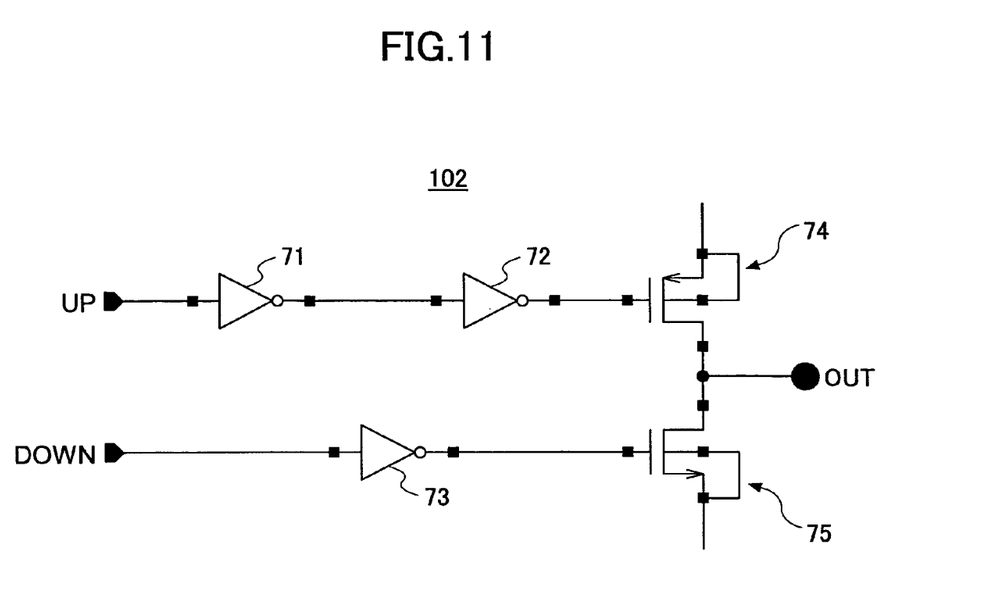
FIG. 11 is a circuit diagram showing an example of the circuit construction of a charge pump.

FIG. 11 is a circuit diagram showing an example of the circuit construction of the charge pump 102. The charge pump 102 of FIG. 11 includes inverters 71 through 73, a PMOS transistor 74, and an NMOS transistor 75. The junction point of the PMOS transistor 74 and the NMOS transistor 75 is an output terminal OUT, which is coupled to the input of the loop filter 103.

When the signal UP is asserted, the PMOS transistor 74 is turned on, and electric charge is supplied to the loop filter 103 through the output terminal OUT. When the signal DOWN is asserted, the NMOS transistor 75 is turned on, and electric charge is drawn out of the loop filter 103 through the output terminal OUT.

Figure 12:
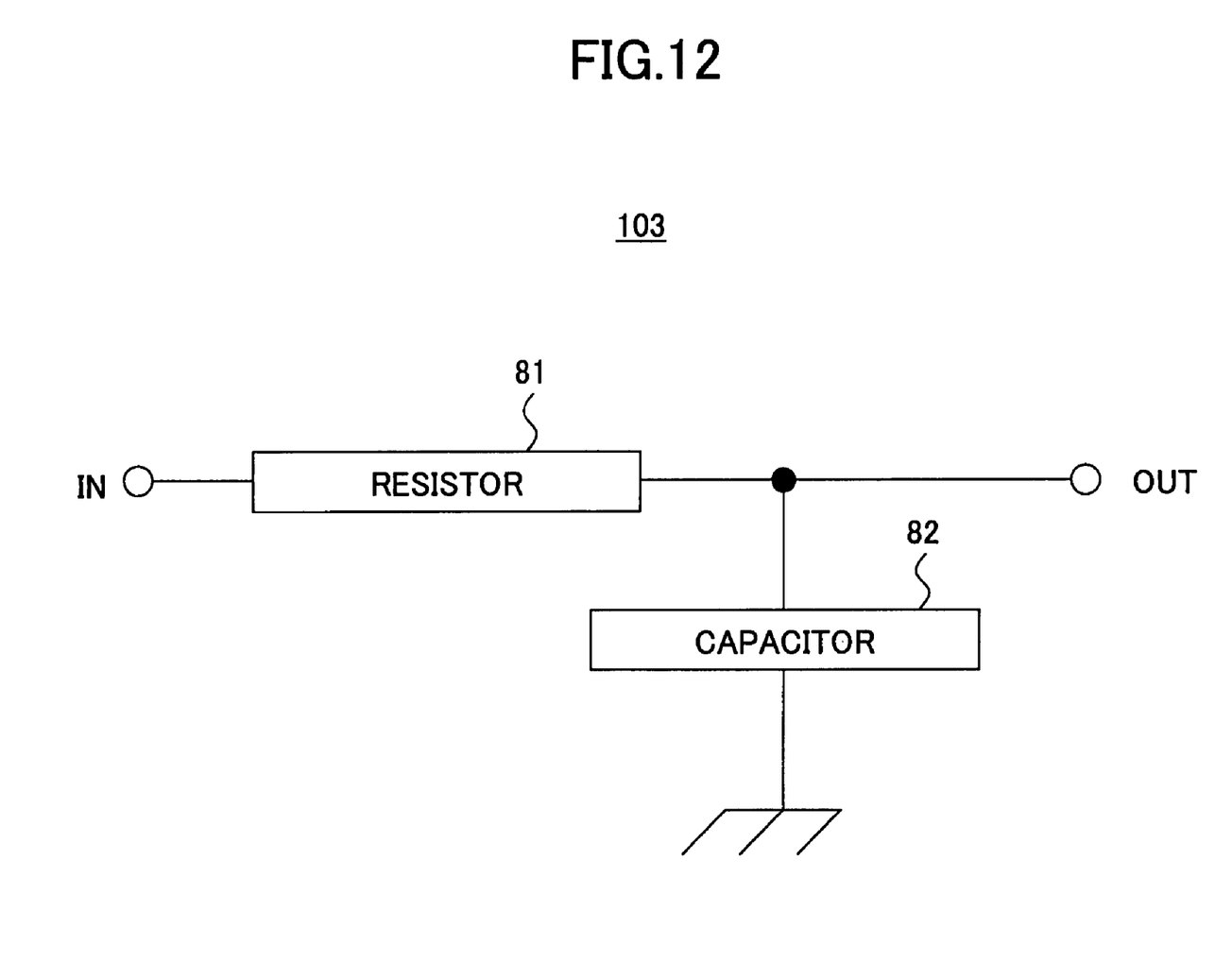
FIG. 12 is a circuit diagram showing an example of the construction of a loop filter.

FIG. 12 is a circuit diagram showing an example of the construction of the loop filter 103. The loop filter 103 shown in FIG. 12 includes a resistor 81 and a capacitor 82. An input terminal IN is coupled to the output terminal of the charge pump 102. When electric charge is supplied from the charge pump 102, the electric charge will be stored in, the capacitor 82 through the resistor 81, resulting in a voltage rise at the output terminal OUT of the loop filter 103. When electric charge is drawn out by the charge pump 102, the electric charge discharges from the capacitor 82 through the resistor 81, resulting in a voltage drop at the output terminal OUT of the loop filter 103.

Figure 13:
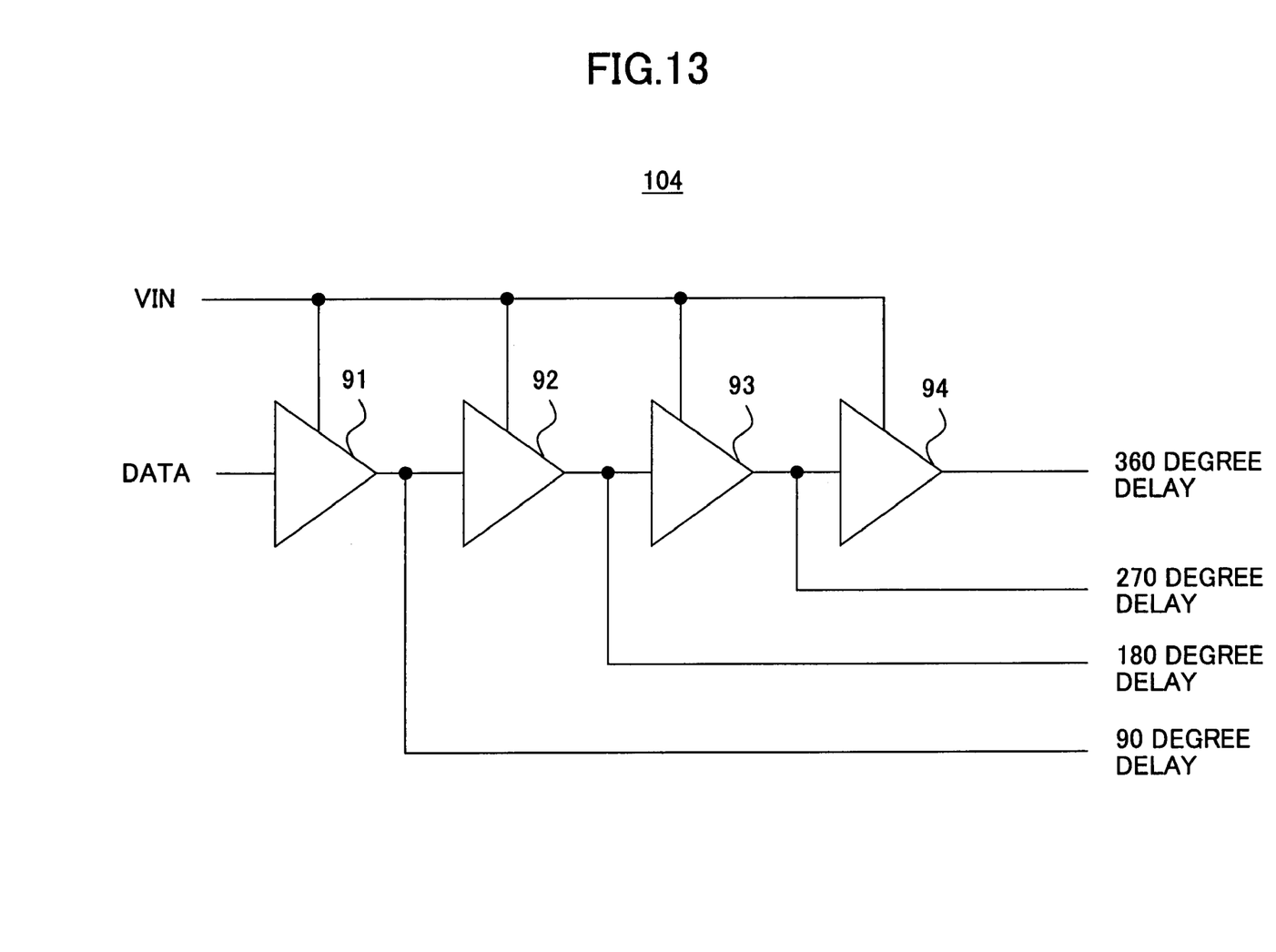
FIG. 13 is a circuit diagram showing an example of the circuit construction of a voltage-controlled delay element.

FIG. 13 is a circuit diagram showing an example of the circuit construction of the voltage-controlled delay element 104. The voltage-controlled delay element 104 of FIG. 13 includes delay elements 91 through 94. The delay elements 91 through 94 receive a direct-current voltage VIN as their drive power supply. This direct-current voltage VIN is a voltage that appears at the output terminal of the loop filter 103. The delay elements 91 through 94 may be simple buffers, for example. As the direct-current voltage VIN serving as drive power supply rises, response speed increases, and the delay time decreases. Conversely, as the direct-current voltage VIN drops, response speed decreases and the delay time increases. The descriptions of the above embodiments have been provided with reference to a case in which the delay length of the voltage-controlled delay element 104 increases as the input control voltage increases. To achieve such operational characteristics, the direct-current voltage VIN may be inverted by an inverter before it is input into the delay elements 91 through 94.

In FIG. 13, the respective outputs of the delay elements 91 through 94 are taken out. When the voltage-controlled delay element 104 is adjusted to have a delay length equal to one clock cycle, therefore, clock signals having 90-degree delay, 180-degree delay, 270-degree delay, and 360-degree delay are generated for use in other circuits.

The above descriptions have been given with reference to an example in which the delay element 104 in the DLL circuit is subjected to voltage-based analog control. Notwithstanding this, the present invention is not limited to a DLL circuit based on analog control, and is applicable to a DLL circuit based on digital control in which the delay length of a delay element is controlled based on digital values. In general, it is more difficult to set an initial delay length to a desired value in the analog-control-based DLL circuit than in the digital-control-based DLL circuit. In the analog-control-based DLL circuit, also, it is more difficult to achieve a desired value for the delay length that is locked in a stable state. Because of these reasons, the present invention may produce more advantageous results when it is applied to the analog-control-based DLL circuit.

Further, the present invention is not limited to these embodiments, but various variations and modifications may be made without departing from the scope of the present invention.

What is claimed is:

1. A DLL circuit, comprising:
   a phase comparator configured to compare timing between a first clock signal and a second clock signal;
   a delay circuit configured to delay the first clock signal by a delay length responsive to a result of comparison by said phase comparator and output the delayed clock signal as the second clock signal; and
   a control circuit configured to suspend supply of the first clock signal to said phase comparator temporarily while the second clock signal is supplied to said phase comparator,
   wherein the control circuit includes a counter configured to count pulses of the first clock signal, and suspends the supply of the first clock signal to the phase comparator while the counter is counting a predetermined number.

2. The DLL circuit as claimed in claim 1 wherein the delay length of the delay circuit is set shorter than one clock cycle of the first clock signal before said phase comparator starts comparing the timing.

3. The DLL circuit as claimed in claim 1, wherein a time during which the supply of the first clock signal is temporarily suspended is longer than one clock cycle of the first clock signal.

4. The DLL circuit as claimed in claim 1, which is implemented as a semiconductor integrated circuit.

5. The DLL circuit as claimed in claim 1, wherein said delay circuit receives an analog signal responsive to the result of comparison by said phase comparator, and adjusts the delay length in response to the analog signal.

6. The DLL circuit as claimed in claim 5, further comprising:
   a loop filter configured to supply a voltage signal serving as said analog signal to said delay circuit; and
   a charge pump configured to control electric charge of said loop filter in response to the result of comparison by said phase comparator.

7. The DLL circuit as claimed in claim 1, wherein said phase comparator compares the timing by comparing a first edge of the first clock signal with an edge of the second clock signal supplied earlier than said first edge, the first edge of the first clock signal being a first to be supplied after the suspension of the first clock signal by said control circuit.

8. A DLL circuit comprising:
   a phase comparator configured to compare timing between a first clock signal and a second clock signal;
   a delay circuit configured to delay the first clock signal by a delay length responsive to a result of comparison by said phase comparator and output the delayed clock signal as the second clock signal; and
   a control circuit configured to suspend supply of the first clock signal to said phase comparator temporarily while the second clock signal is supplied to said phase comparator,
   wherein said control circuit includes a counter configured to count pulses of the first clock signal, and wherein said control circuit controls said delay circuit so as to set the delay length to a minimum value while said counter is counting a first predetermined number, and suspends the supply of the first clock signal to said phase comparator while said counter is counting a second predetermined number.

9. A DLL circuit, comprising:
   a phase comparator configured to compare timing between a first clock signal and a second clock signal;
   a delay circuit configured to delay the first clock signal by a delay length responsive to a result of comparison by said phase comparator and output the delayed clock signal as the second clock signal; and
   a control circuit configured to suspend supply of the first clock signal to said phase comparator temporarily while the second clock signal is supplied to said phase comparator,
   wherein said control circuit is further configured to detect a cessation of the first clock signal, and, upon resumption of the first clock signal, suspends the supply of the first clock signal to said phase comparator temporarily while the second clock signal is supplied to said phase comparator.

* * * * *